US012367936B2

(12) United States Patent
Chen et al.

(10) Patent No.: US 12,367,936 B2
(45) Date of Patent: *Jul. 22, 2025

(54) PAGE BUFFER CIRCUIT WITH BIT LINE SELECT TRANSISTOR

(71) Applicant: Yangtze Memory Technologies Co., Ltd., Hubei (CN)

(72) Inventors: Teng Chen, Wuhan (CN); Yan Wang, Wuhan (CN); Jing Wei, Wuhan (CN); Yang Zhang, Wuhan (CN); Kuriyama Masao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/157,186

(22) Filed: Jan. 20, 2023

(65) Prior Publication Data

US 2023/0154545 A1    May 18, 2023

Related U.S. Application Data

(63) Continuation of application No. 17/190,691, filed on Mar. 3, 2021, now Pat. No. 11,581,045, which is a
(Continued)

(51) Int. Cl.
*G11C 16/04*    (2006.01)
*G11C 7/10*    (2006.01)
(Continued)

(52) U.S. Cl.
CPC ............ *G11C 16/24* (2013.01); *G11C 7/1057* (2013.01); *G11C 7/1084* (2013.01);
(Continued)

(58) Field of Classification Search
CPC ................................................... G11C 7/1057
(Continued)

(56) References Cited

U.S. PATENT DOCUMENTS

| 9,424,928 B2 | 8/2016 | Hwang et al. |
| 9,589,643 B2 | 3/2017 | Hwang et al. |

(Continued)

FOREIGN PATENT DOCUMENTS

| CN | 1591690 A | 3/2005 |
| CN | 101454839 A | 6/2009 |

(Continued)

OTHER PUBLICATIONS

International Search Report issued Aug. 30, 2021 in PCT/CN2020/136768, 5 pages.
(Continued)

*Primary Examiner* — Hoai V Ho
(74) *Attorney, Agent, or Firm* — Oblon, McClelland, Maier & Neustadt, L.L.P.

(57) ABSTRACT

Aspects of the disclosure provide a memory device. For example, the memory device can include a memory array, a bit line and a buffer. The memory array can include a plurality of memory strings. The memory strings can be divided into a first memory string group and a second memory string group. The bit line can include a first bit line segment coupled to the first memory string group and a second bit line segment coupled to the second memory string group. The buffer can be coupled to the memory array by the bit line. The memory array and the buffer can be included in separate first and second dies, respectively, and the first die can be bonded to the second die.

17 Claims, 11 Drawing Sheets

Related U.S. Application Data continuation of application No. PCT/CN2020/136768, filed on Dec. 16, 2020.

(51) Int. Cl.
  *G11C 16/14* (2006.01)
  *G11C 16/24* (2006.01)
  *G11C 16/26* (2006.01)

(52) U.S. Cl.
  CPC .......... *G11C 16/0483* (2013.01); *G11C 16/14* (2013.01); *G11C 16/26* (2013.01)

(58) Field of Classification Search
  USPC ........................................ 365/185.11, 185.29
  See application file for complete search history.

(56) References Cited

U.S. PATENT DOCUMENTS

| | | | |
|---|---|---|---|
| 10,566,340 | B1 | 2/2020 | Son et al. |
| 10,804,293 | B2 | 10/2020 | Park et al. |
| 11,581,045 | B2 * | 2/2023 | Chen ...................... G11C 16/24 |
| 2008/0080236 | A1 | 4/2008 | Kim |
| 2012/0275257 | A1 | 11/2012 | Park |
| 2015/0303209 | A1 * | 10/2015 | Park ...................... H10B 43/40 257/316 |
| 2016/0163386 | A1 | 6/2016 | Hwang et al. |
| 2016/0343440 | A1 | 11/2016 | Hwang et al. |
| 2020/0058668 | A1 | 2/2020 | Son et al. |
| 2020/0135758 | A1 | 4/2020 | Park et al. |
| 2020/0363989 | A1 | 11/2020 | Li et al. |
| 2021/0295924 | A1 * | 9/2021 | Lee ...................... H10B 43/35 |
| 2021/0327837 | A1 * | 10/2021 | Yoon ...................... H10B 43/27 |

FOREIGN PATENT DOCUMENTS

| | | |
|---|---|---|
| CN | 101553876 A | 10/2009 |
| CN | 105051825 A | 11/2015 |
| CN | 110291586 A | 9/2019 |
| CN | 110838492 A | 2/2020 |
| CN | 110892274 A | 3/2020 |
| CN | 111106120 A | 5/2020 |

OTHER PUBLICATIONS

Combined Chinese Office Action and Search Report issued Apr. 6, 2022 in Patent Application No. 202080003950.3 (with English translation of Category of Cited Documents), 14 pages.

* cited by examiner

PAGE BUFFER CIRCUIT WITH BIT LINE SELECT TRANSISTOR

RELATED APPLICATION

The present application is a continuation of U.S. application Ser. No. 17/190,691, filed on Mar. 3, 2021, which is a bypass continuation of International Application No. PCT/CN2020/136768, filed on Dec. 16, 2020. The entire disclosures of the prior applications are hereby incorporated by reference in their entirety.

TECHNICAL FIELD

The present application describes embodiments generally related to semiconductor memory devices.

BACKGROUND

Semiconductor memory devices can be categorized into volatile memory devices and non-volatile memory devices. Generally, volatile memory devices lose data when power is off, while non-volatile memory devices can retain stored data even when power is disconnected. In order to achieve higher data storage density, semiconductor memory manufactures developed vertical device technologies, such as three dimensional (3D) NAND flash memory technology, and the like. Such 3D NAND flash memory is a kind of non-volatile memory device. A multi-plane NAND flash memory can have multiple planes, each of which can include a plurality of blocks. Data stored in the blocks can be read and buffered in page buffers.

SUMMARY

Aspects of the disclosure provide a memory device. For example, the memory device can include a memory array, a bit line and a buffer. The memory array can include a plurality of memory strings, the memory strings including at least a first memory string group and a second memory string group. The bit line can include a first bit line segment coupled to the first memory string group and a second bit line segment coupled to the second memory string group. The buffer can be coupled to the memory array by the bit line. The memory array can be included in a first die, and the buffer can be included in a second die that is separated from and bonded to the first die.

In an embodiment, the memory device can further include vias, wherein the first bit line segment is coupled to the buffer by the vias.

In another embodiment, the memory device can further include a first switch disposed coupled between the buffer and the first bit line segment, and a second switch coupled between the buffer and the second bit line segment. For example, the first switch can be configured to be turned on to couple the first bit line segment to the buffer in response to a first switch signal. As another example, the second switch can be configured to be turned on to couple the second bit line segment to the buffer in response to a second switch signal. In an embodiment, one of the first switch and the second switch can be turned on when the memory device is operating in a program mode or a read mode. In some embodiments, both the first switch and the second switch can be turned on when the memory device is operating in an erase mode. In various embodiments, the bit line can be included in the first die, and the first switch and the second switch can be included in the second die.

In an embodiment, the memory device can further include a first memory plane. For example, the first memory string group and the second memory string group can be included in the first memory plane.

Aspects of the present disclosure further provide a memory device. For example, the memory device can include a first memory plane, first bit lines, a second memory plane, second bit lines, and page buffers. The first memory plane can include a plurality of first memory arrays. The first bit lines can be coupled to the first memory arrays of the first memory plane, respectively. The second memory plane can include a plurality of second memory arrays. The second bit lines can be coupled to the second memory arrays of the second memory plane, respectively. The page buffers each can be coupled to a corresponding one of the first bit lines and a corresponding one of the second bit lines.

In an embodiment, the first and second memory planes and the page buffers can be included in separate first and second dies, respectively, and the first die is bonded to the second die. In another embodiment, the memory device can further include first plane switches and second plane switches. For example, each of the page buffers can be coupled via one of the first plane switches to a corresponding one of the first bit lines and coupled via one of the second plane switches to a corresponding one of the second bit lines. In some embodiments, the first plane switches or the second plane switches can be turned on when the memory device is operating in an erase mode, a program ode or a read mode.

In various embodiments, the first and second memory planes and the page buffers can be included in separate first and second dies, respectively, the first die can be bonded to the second die, and the first and second plane switches can be included in the second die.

In some embodiments, one of the first memory arrays of the first memory plane can include a plurality of memory strings, the memory strings including at least a first memory string group and a second memory string group, one of the first bit lines that is coupled to the one of the first memory arrays of the first memory plane can include a first bit line segment coupled to the first memory string group and a second bit line segment coupled to the second memory string group, and the memory device can further include a buffer coupled to the one of the first memory array by the one of the first bit lines. In an embodiment, the memory device can further include a first switch and a second switch. For example, the first switch can be coupled between the buffer and the first bit line segment and configured to be turned on to couple the first bit line segment to the buffer in response to a first switch signal, and the second switch can be coupled between the buffer and the second bit line segment and configured to be turned on to couple the second bit line segment to the buffer in response to a second switch signal.

BRIEF DESCRIPTION OF THE DRAWINGS

Exemplary embodiments of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
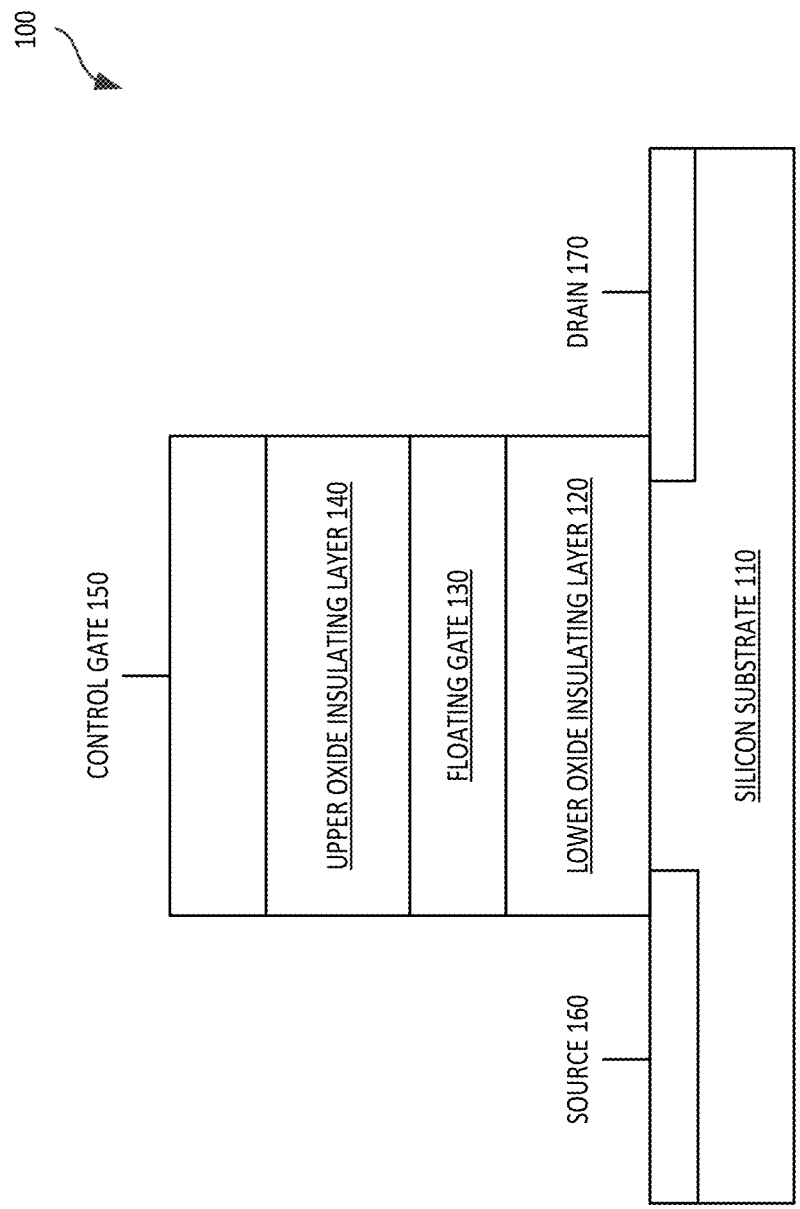
FIG. 1 shows an exemplary NAND flash memory cell according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the rapid development of 3D memory technology, a memory plane of a 3D memory device can have an increasing number of memory blocks. As the number of the memory blocks increases, the bit lines that couple the memory blocks will become very long. For example, the bit lines can be as long as 2,000 μm. When too long, the bit lines can have large parasitic parameters and long charging time. Accordingly, the 3D memory device can consume high power. In some embodiments of the disclosure, at least one of the bit lines can be cut into at least two bit line segments, e.g., a first bit line segment and a second bit line segment. For example, the first bit line segment can be coupled to some memory strings of a memory array of the memory device, and the second bit line segment can be coupled to the others of the memory strings of the memory device.

In an embodiment, a first switch, when activated, can couple the first bit line segment to a buffer. In another embodiment, a second switch, when activated, can couple the second bit line segment to the buffer. In some other embodiments of the disclosure, a memory device can have at least two memory planes, e.g., a first memory plane and a second memory plane, which share a common page buffer. For example, a first plane switch, when activated, can couple first bit lines coupled to the first memory plane to the page buffer. As another example, a second plane switch, when activated, can couple second bit lines coupled to the second memory plane also to the page buffer.

FIG. 1 shows an exemplary NAND flash memory cell 100 according to some embodiments of the disclosure. The NAND cell 100 can store electrical charges in a floating gate 130, which is isolated above and below by an upper oxide insulating layer 140 and a lower oxide insulating layer 120, respectively. When the floating gate 130 is charged, the NAND cell 100 can be programmed, representing a binary value "0." When the floating gate 130 has no charge, the NAND cell 100 can be erased, representing a binary value "1." To program the NAND cell 100, a high voltage can be applied to a control gate 150 above the upper oxide insulating layer 140, and electrons will move from a silicon substrate 110 below the lower oxide insulating layer 120 to the floating gate 130 by "tunneling" through the lower oxide insulating layer 120. The electrons can then be trapped in the floating gate 130 for up to several years. To erase the NAND cell 100, a high voltage can be applied to the silicon substrate 110, and electrons will move from the floating gate 130 to the silicon substrate 110. To read the NAND cell 100, a read reference voltage can be applied to the control gate 150. When there is a current flow between a source 160 and a drain 170, the floating gate 130 is not charged and the binary value "1" shall be read. When there is no current flow between the source 160 and the drain 170, the floating gate 130 is charged and the binary value "0" shall be read.

The example shown in FIG. 1 is a single-level cell (SLC) NAND memory cell, which can store one bit of data. There are also multi-level cell (MLC) NAND memory cells, triple-level cell (TLC) NAND memory cells and quad-level cell (QCL) NAND memory cells, which can store two, three and four bits of data, respectively. The one, two, three, and four bits of data correspond to two, four, eight and sixteen distinct voltage levels, respectively. The maximum voltage applied to each NAND memory cell is approximately the same. Therefore, an SLC NAND memory cell can have a sufficiently large guard band between its two voltage levels, and be able to withstand temperature extremes and other adverse effects, such as the degrading rate, much better than MLC, TLC and QLC NAND memory cells.

Figure 2:
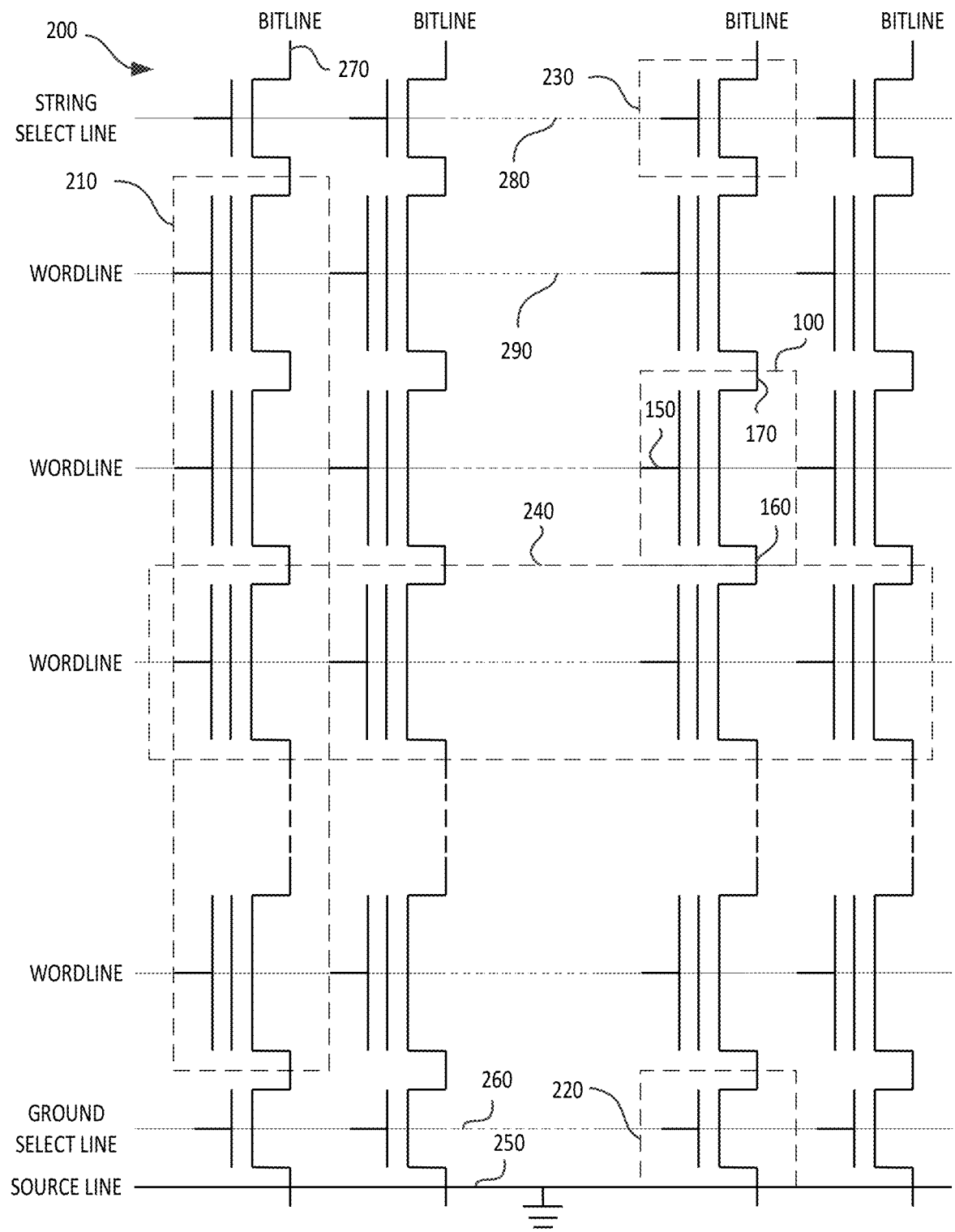
FIG. 2 shows an exemplary NAND flash memory block according to some embodiments of the disclosure.

FIG. 2 shows an exemplary NAND flash memory block 200 according to some embodiments of the disclosure. Blocks are the minimum unit to erase. The NAND block 200 can include a plurality of the SLC NAND memory cells 100 arranged in an array. In other embodiments, the NAND block 200 can include a plurality of MLC, TLC, or QLC NAND memory cells. Memory strings 210 (shown as columns in a vertical direction) in the NAND block 200 are the minimum unit to read and each can typically include 32 or 64 of the NAND memory cells 100 connected in series with one another, with each of the NAND memory cells 100 representing a bit of data (binary value "0" or "1").

As shown, each of the memory strings 210 is connected at one end to a common source line 250 via a ground select line (GSL) transistor 220 controlled by a ground select line 260 and at the other end to a bit line 270 via a string select line (SSL) transistor 230 controlled by a string select line 280. Operations of each of the memory strings 210 can be controlled by turning its GSL transistor 220 and SSL transistor 230 on or off. For example, the SSL transistor 230 can be used to enable operations of a memory string, and the GSL transistor 230 can be used to connect the memory string to ground during a read process. In order to read a single NAND memory cell of the memory string, all remaining NAND memory cells (i.e., unread NAND memory cells) of the same memory string must be switched on (e.g., by applying a pass-through voltage thereto) to allow the binary value of the single NAND memory cell that is being read to pass through to a sense amplifier (not shown) connected to the memory string. Pages 240 (shown as rows) in the NAND block 200 are the minimum unit to program and each can typically include at least 32,768 (i.e., 4K) of the NAND memory cells 100 that share the same wordline 290.

Figure 3:
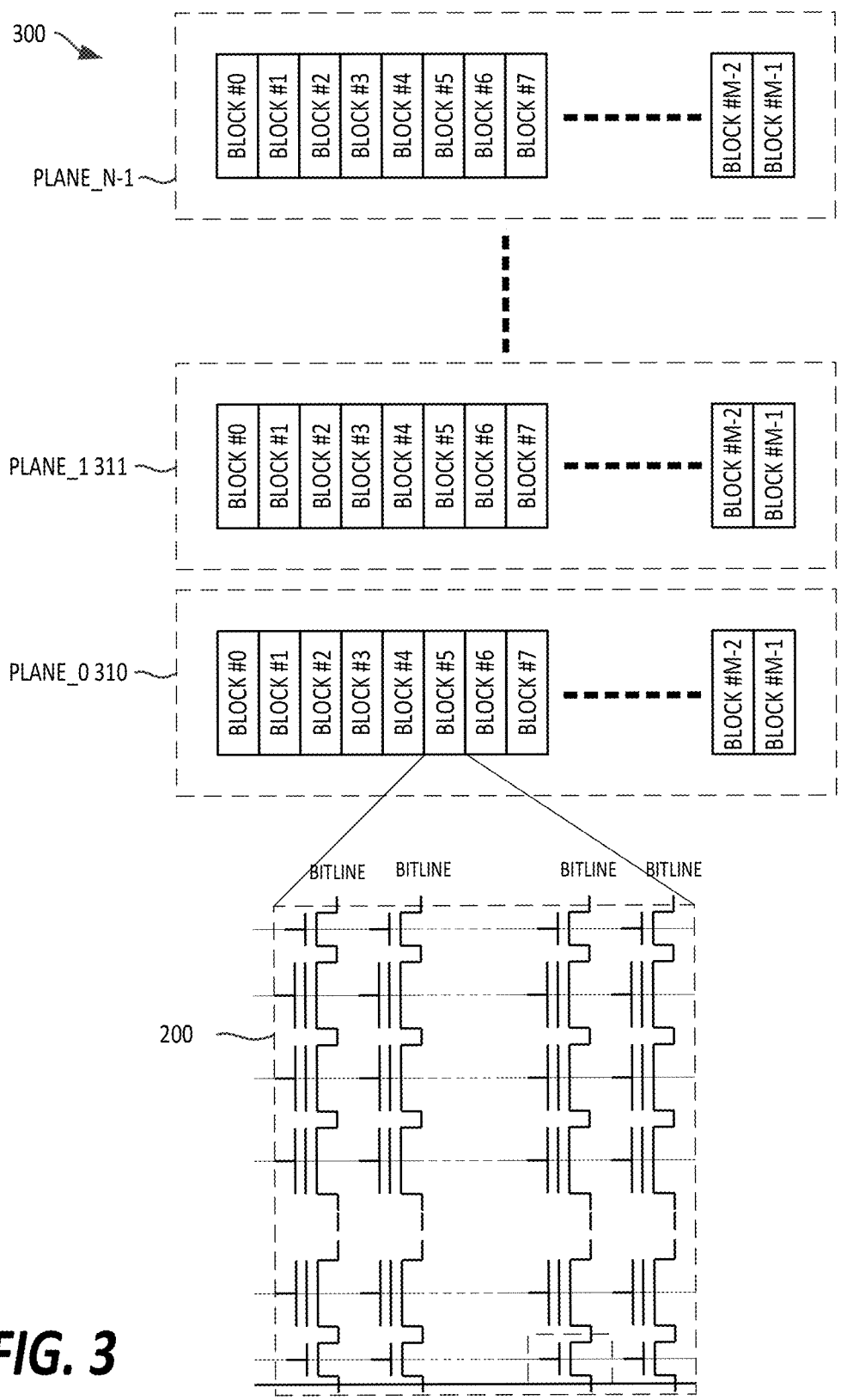
FIG. 3 shows an exemplary multi-plane NAND flash memory die according to some embodiments of the disclosure.

FIG. 3 shows an exemplary multi-plane NAND flash memory die 300 according to exemplary embodiments of the disclosure. The NAND die 300 can include a plurality of NAND flash memory planes_0 to _n−1, which can be stacked on top of one another. For example, the NAND die 300 can include two memory planes, e.g., a memory plane_0 310 and a memory plane_1 311. The NAND die 300 can also include four or six memory planes. Each of the NAND memory planes_0 to _n−1 can include a plurality of the memory blocks 200, e.g., memory blocks #0 to #m−1. One or a plurality of the NAND dies 300 can form an NAND flash memory chip. An SSD can include several NAND chips, which are connected to an NAND flash memory controller using multiple channels.

Figure 4:
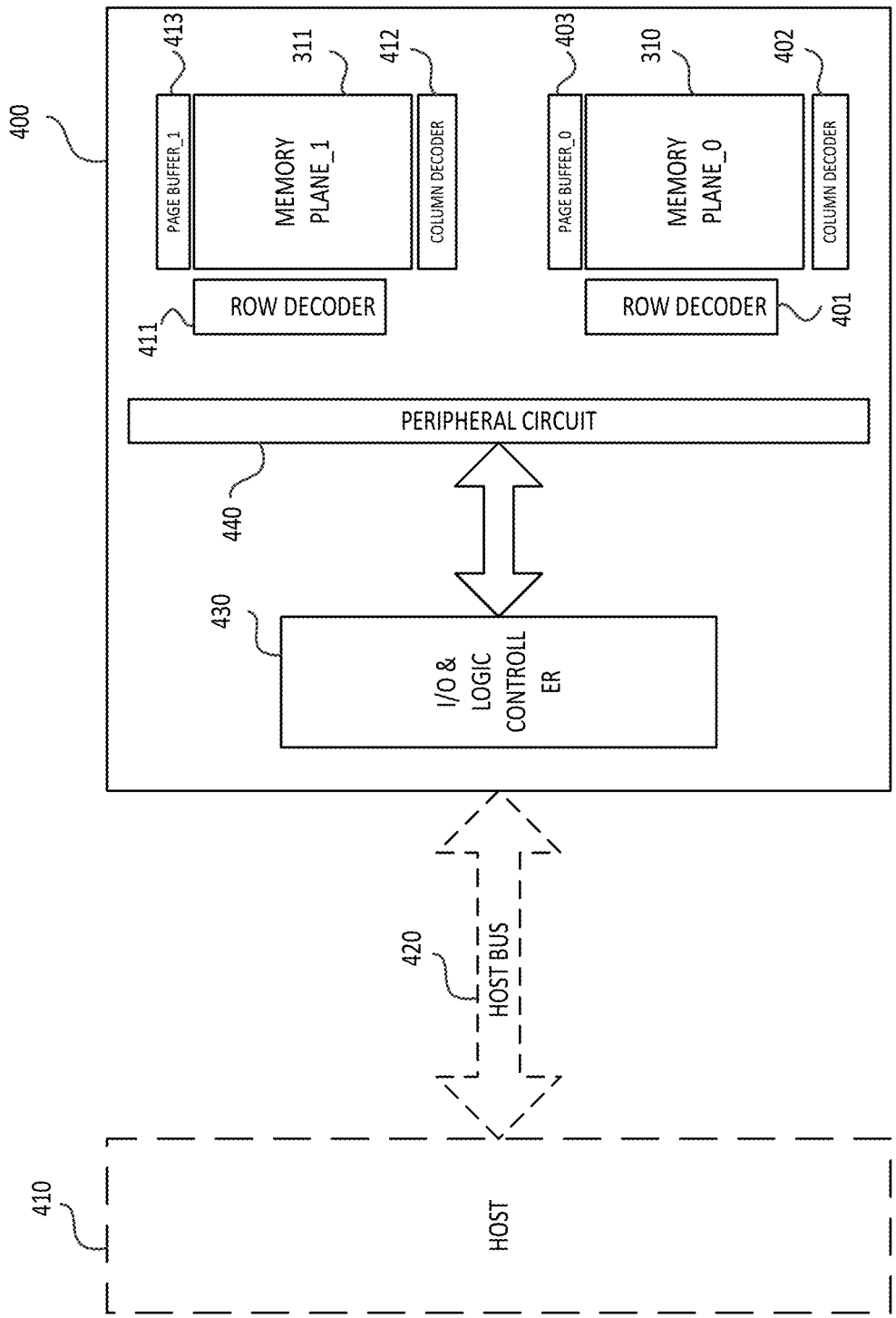
FIG. 4 shows an exemplary solid state drive (SSD) according to some embodiments of the disclosure.

FIG. 4 shows an exemplary SSD 400 according to some embodiments of the disclosure. The SSD 400 can communicate with a host 410 via a host bus 420. For example, the host 410 can transmit commands and data via the host bus 420 to the SSD 400, and the SSD 400 can transmit data via the host bus 420 to the host 410. The host 410 can be a computer. The host bus 420 can be a universal serial bus (USB), a serial advanced technology attachment (SATA), a parallel advanced technology attachment (PATA) or a peripheral component interconnect express (PCIe). The SSD 400 can include the NAND die 300, an I/O and logic controller 430 and a peripheral circuit 440. The NAND die 300 can include at least one memory plane. For example, the NAND die 300 can include a first memory plane and a second memory plane (e.g., the memory plane_0 310 and the memory plane_1 311).

The peripheral circuit 440 can include an address register, a status register, a logic control circuit, an I/O circuit, a ready/busy control circuit (not shown), etc., and be coupled between the I/O and logic controller 430 and row decoders 401 and 411, column decoder 402 and 412, the memory plane_0 310 and the memory plane_1 311. The peripheral circuit 440 can receive various control signals from the I/O and logic controller 430, such as a chip enable signal, a command latch enable signal, an address latch enable signal, a write enable signal, a read enable signal, etc. The peripheral circuit 440 can further transmit write data from the I/O and logic controller 430 to the memory plane_0 310 and the memory plane_1 311 and read data from the memory plane_0 310 and the memory plane_1 311 to the I/O and logic controller 430. The row decoders 401 and 411 can select wordlines corresponding to target memory cells of the memory plane_0 310 and the memory plane_1 311, respectively, and apply desired voltages to the selected wordlines and other unselected wordlines. A page buffer_0 403 and a page buffer_1 413 can hold data during the operations of the memory plane_0 310 and the memory plane_1 311. The SSD 400 can further include caches (not shown), which can be coupled to the page buffer_0 403 and the page buffer_1 413 and be included in respective sense amplifiers (not shown). The caches can read data from the memory plane_0 310 and the memory plane_1 311 buffered in the page buffer_0 403 and the page buffer_1 413, respectively, output the data to the I/O and logic controller 430, and transmit write data from the I/O and logic controller 430 to the memory plane_0 310 and the memory plane_1 311, respectively.

Figure 5:
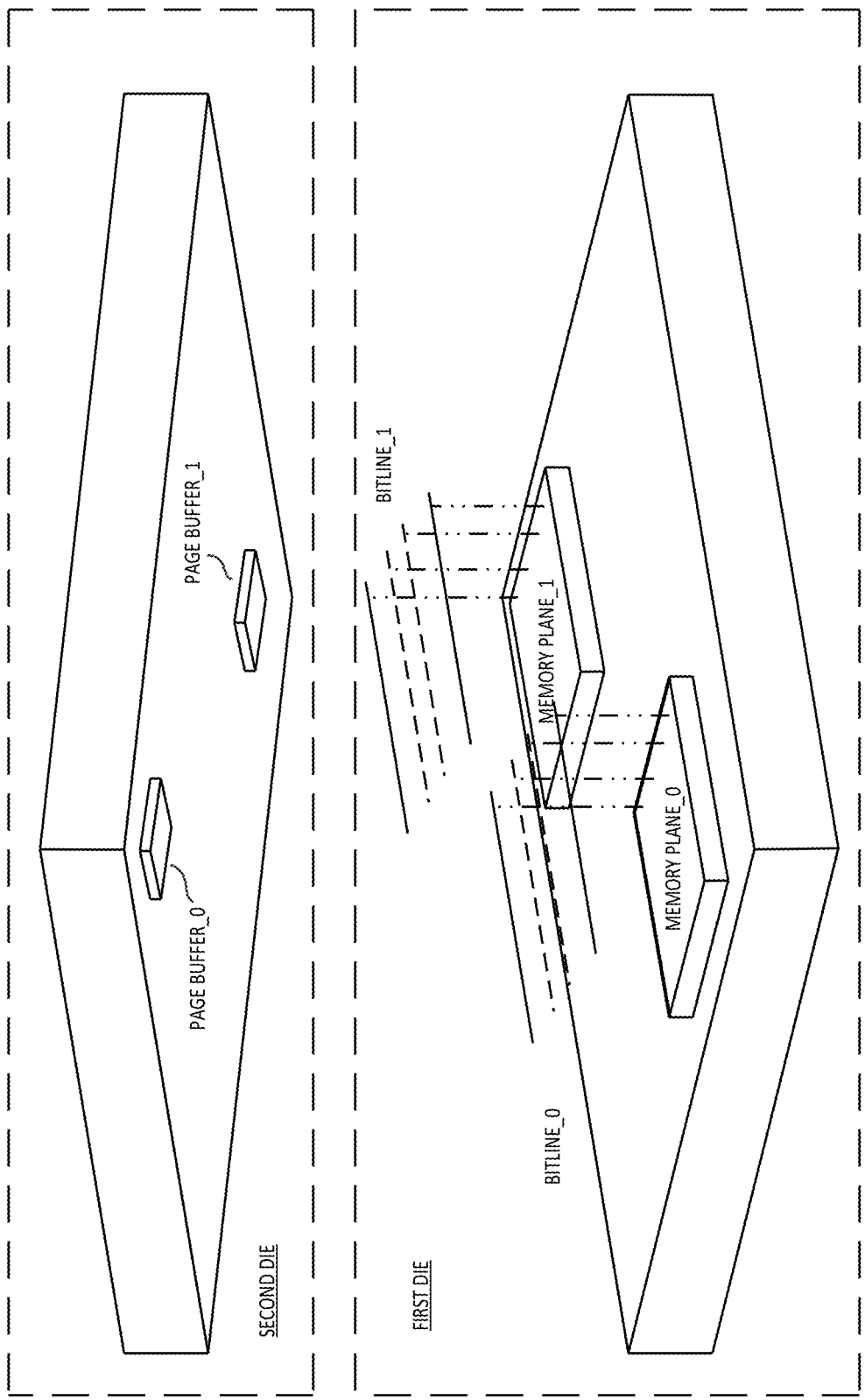
FIG. 5 shows an exemplary block diagram of a memory device according to some embodiment of the disclosure.

In an embodiment, the memory plane_0 310 and the memory plane_1 311 and their respective bit lines_0 and bit lines_1 can be included in a first die, such as an array chip, and the page buffer_0 403, the page buffer_1 413 and the periphery circuit 440 can be included in a second die, such as a CMOS chip, as shown in FIG. 5. For example, the CMOS chip can be bonded to and stacked on the array chip, the bit lines_0 can be provided between the memory plane_0 310 and the page buffer_0 403 and couple the memory plane_0 310 to the page buffer_0 403 through metal vertical interconnect accesses, VIAs), and the bit lines_1 can be provided between the memory plane_1 311 and the page buffer_1 413 and couple the memory plane_1 311 to the page buffer_1 413 through vias. 3D NAND memory technology with CMOS under array also builds a 3D NAND array chip over a peripheral circuit of a CMOS chip. As another example, the page buffer_0 403 can be disposed closer to the bit lines_0 than to the memory plane_0, and the page buffer_1 413 can be disposed closer to the bit lines_1 than to the memory plane_1. In an embodiment, the bit lines_0 and the bit lines_1 can be disposed at a side surface of the first die that faces the second die.

Figure 6:
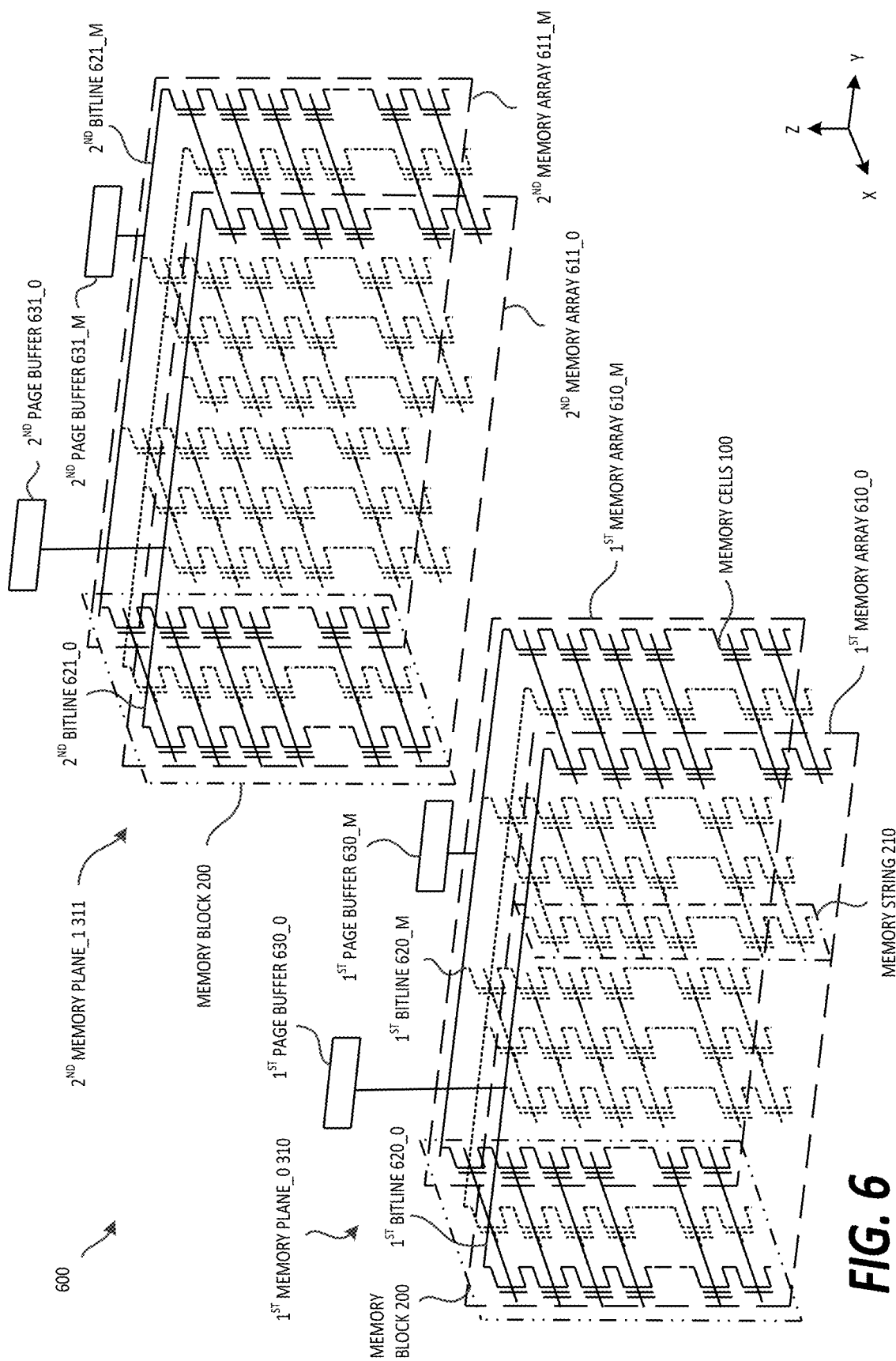
FIG. 6 shows an exemplary memory device according to some embodiment of the disclosure.

FIG. 6 shows an exemplary memory device 600 according to some embodiment of the disclosure. For example, the memory device 600 can include the array chip and the CMOS chip shown in FIG. 5. The array chip can include the memory plane_0 310, the memory plane_1 311 and bit lines_0 and 1, and the CMOS chip can include the page buffer_0 403 and the page buffer_1 413. A first memory plane, e.g., the memory plane_0 310, can include a plurality of first memory arrays 610_0 to 610_$m$ arranged in a first horizontal direction, e.g., X-direction (or a plurality of first memory blocks, e.g., the memory blocks 200, which are arranged in a second horizontal direction, e.g., Y-direction). Each of the first memory arrays 610_0 to 610_$m$ can include a plurality of first memory strings, e.g., the memory strings 210, which are arranged in the second horizontal direction. Each of the first memory strings 210 can include a plurality of first memory cells, e.g., the memory cells 100, which are serially coupled in a vertical direction, e.g., Z-direction. A plurality of first bit lines 620_0 to 620_$m$ can correspond to the plurality of first memory arrays 610_0 to 610_$m$, be arranged above the first memory plane_0 310, and each extend in the second horizontal direction. The first bit lines 620_0 to 620_$m$ can be coupled to the first memory arrays 610_0 to 610_$m$ of the first memory plane_0 310, respectively.

A second memory plane, e.g., the memory plane_1 311, can include a plurality of second memory arrays 611_0 to 611_$m$ arranged in the first horizontal direction (or a plurality of second memory blocks, e.g., the memory blocks 200, which are arranged in the second horizontal direction). Each of the second memory arrays 611_0 to 611_$m$ can include a plurality of second memory strings, e.g., the memory strings 210, which are arranged in the second horizontal direction. Each of the second memory strings 210 can include a plurality of second memory cells, e.g., the memory cells, 100, which are serially coupled in the vertical direction. A plurality of second bit lines 621_0 to 621_m can correspond to the plurality of second memory arrays 611_0 to 611_m, be arranged above the second memory plane_1 310, and each extend in the second horizontal direction. The second bit lines 621_0 to 621_m can be coupled to the second memory arrays 611_0 to 611_m of the second memory plane_1 311, respectively. In an embodiment, the second memory plane_1 311 can be stacked on the first memory plane_ 310 in the first direction. In another embodiment, the second memory plane_1 311 can be stacked on the first memory plane 310 in the second direction.

The memory device 600 can further include first page buffers 630_0 to 630_m, e.g., the page buffer_0 403. The first page buffers 630_0 to 630_m can be arranged above and coupled to the first bit lines 620_0 to 620_m, respectively, to hold data during the operation of the first memory arrays 610_0 to 610_m, respectively. In an embodiment, the first page buffers 630_0 to 630_m can be included in a single chip.

The first page buffers 630_0 to 630_m can hold data read from the first memory plane_0 310 during a read operation of the first memory plane_0 310, and hold data to be written to the first memory plane_0 310 during a program operation of the first memory plane_0 310.

The memory device 600 can further include second page buffers 631_0 to 631_m, e.g., the page buffers_1 413. The second page buffers 631_0 to 631_m can be arranged above and coupled to the second bit lines 621_0 to 621_m, respectively, to hold data during the operation of the second memory arrays 611_0 to 611_m, respectively. In an embodiment, the second page buffers 631_0 to 631_m can be included in a single chip.

The second page buffers 631_0 to 631_m can hold data read from the second memory plane_1 311 during a read operation of the second memory plane_1 311, and hold data to be written to the second memory plane_1 311 during a program operation of the second memory plane_1 311.

Figure 7:
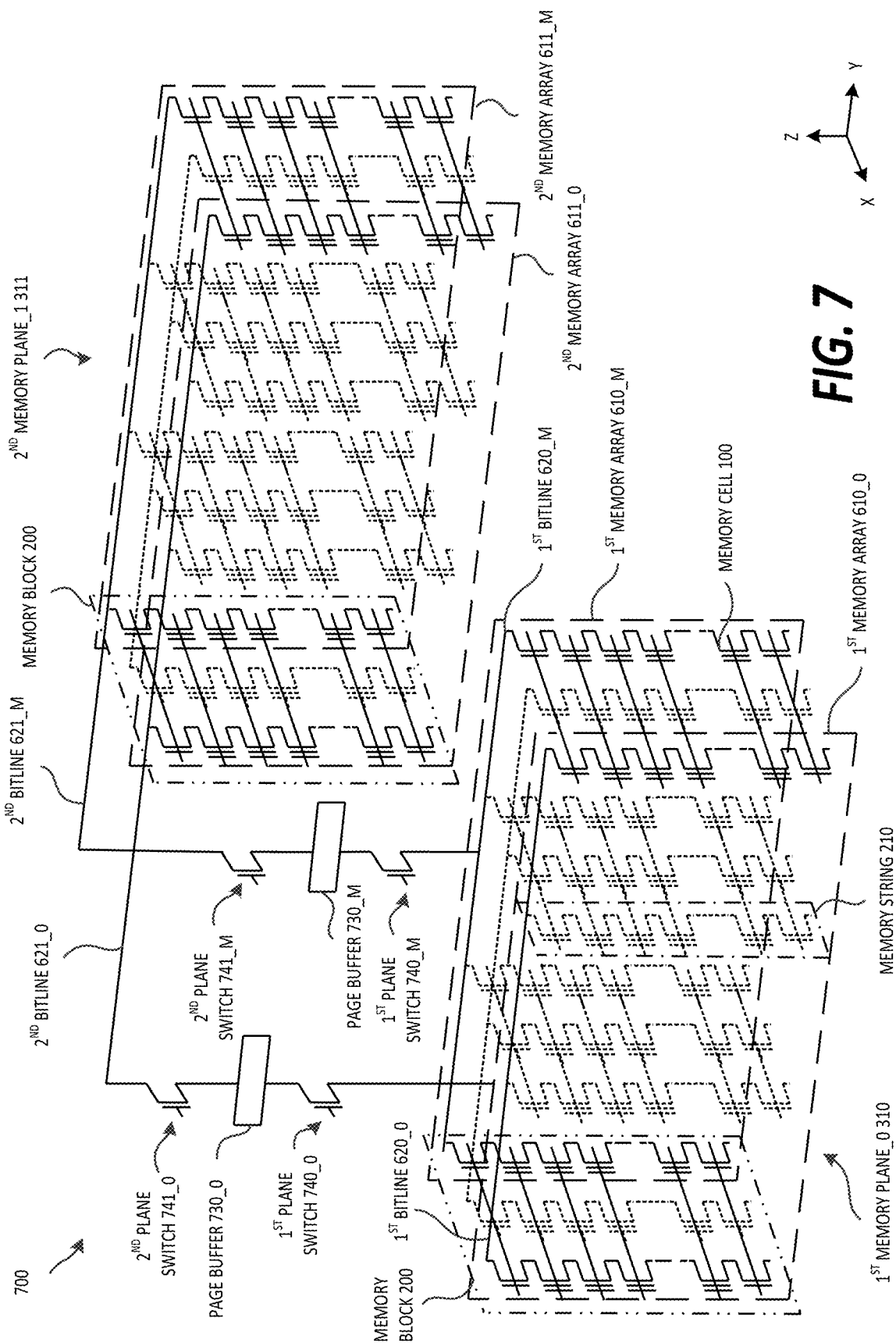
FIG. 7 shows an exemplary memory device according to some embodiment of the disclosure.

FIG. 7 shows an exemplary memory device 700 according to some embodiment of the disclosure. The memory device 700 can differ from the memory device 600 of FIG. 6 at least in that the memory device 700 can include page buffers 730_0 to 730_m, first plane switches 740_0 to 740_m and second plane switches 741_0 to 741_m that replace the first page buffers 630_0 to 630_m and the second page buffers 631_0 to 631_m of the memory device 600. In the exemplary memory device 700, the first memory plane_0 310 (or the first bit lines 620_0 to 620_m) and the second memory plane_1 311 (or the second bit lines 621_0 to 621_m) can share the page buffers 730_0 to 730_m.

In an embodiment, the first plane switches 740_0 to 740_m each can correspond to one of the first bit lines 620_0 to 620_m, and be configured to couple the first bit line to a corresponding one of the page buffers 730_0 to 730_m when activated (or turned on). In another embodiment, the second plane switches 741_0 to 741_m each can correspond to one of the second bit lines 621_0 to 621_m, and be configured to couple the second bit line to a corresponding one of the page buffers 730_0 to 730_m when activated.

For example, when the first memory plane_0 310 is selected, the first plane switches 740_0 to 740_m are activated to couple the first bit lines 620_0 to 620_m to the page buffer 730_0 to 730_m, and the page buffers 730_0 to 730_m can hold data read from the first memory plane_0 310 during a read operation of the first memory plane_0 310 or hold data to be written to the first memory plane_0 310 during a program operation of the first memory plane_0 310. As another example, when the second memory plane_1 311 is selected, the second plane switches 741_0 to 741_m are activated to couple the second bit lines 621_0 to 621_m to the page buffer 730_0 to 730_m, and the page buffers 730_0 to 730_m can hold data read from the second memory plane_1 311 during a read operation of the second memory plane_1 311 or hold data to be written to the second memory plane_1 311 during a program operation of the second memory plane_1 311.

Figure 11:
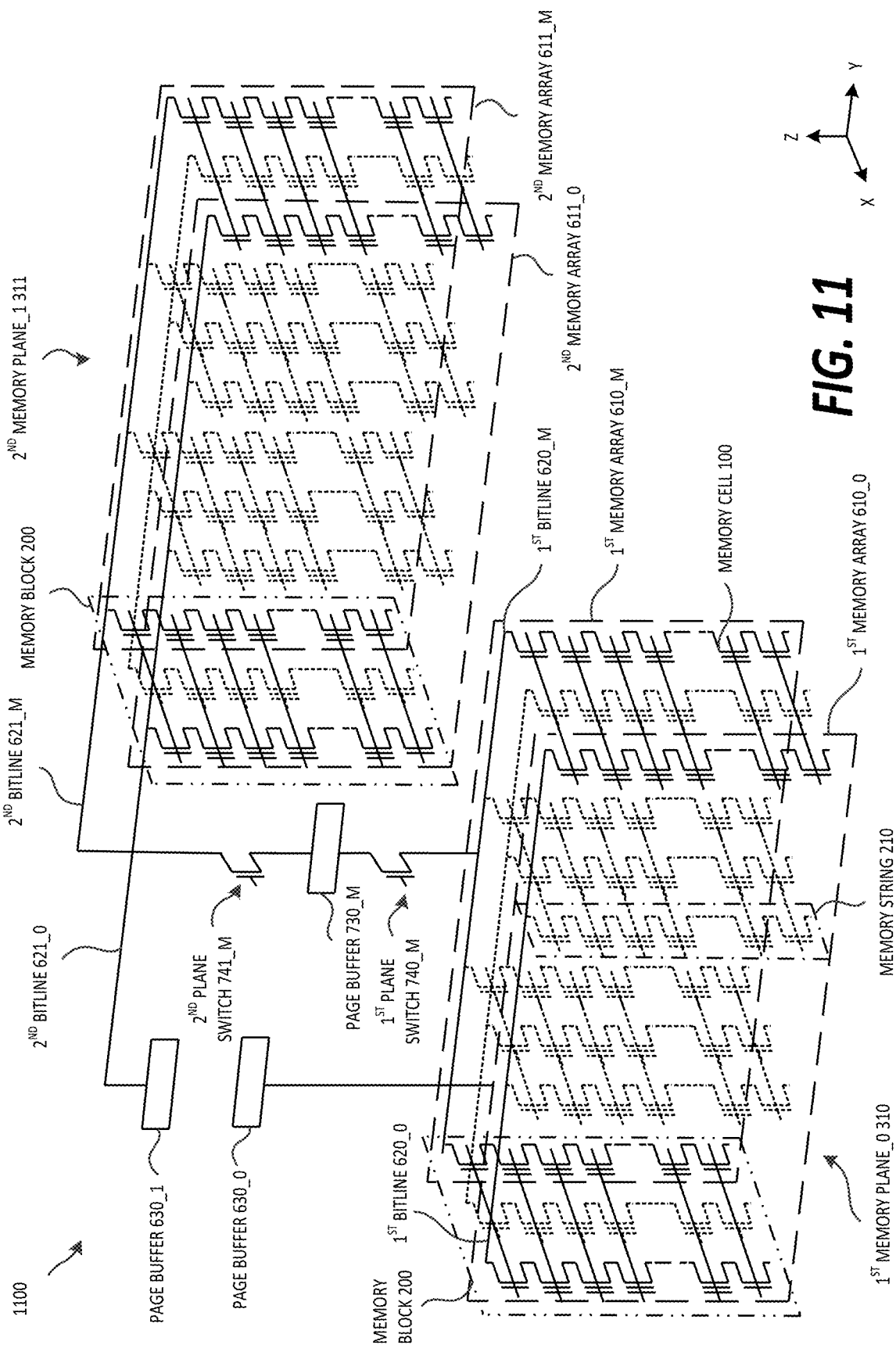
FIG. 11 shows an exemplary memory device according to some embodiments of the disclosure.

In the exemplary memory device 700 shown in FIG. 7, all the first bit lines 620_0 to 620_m and all the second bit lines 621_0 to 621_m share the page buffers 730_0 to 730_m. In an embodiment, at least one of the first bit lines 620_0 to 620_m and one of the second bit lines 621_0 to 621_m that corresponds to the first bit line can have their own page buffers. For example, the page buffer 730_0 can include a first page buffer part, e.g., the first page buffer 630_0, and a second page buffer part, e.g., the second page buffer 631_0, the first plane switch 740_0 can always couple the first bit line 620_0 to the first page buffer 630_0, and the second plane switch 741_0 can always couple the second bit line 621_0 to the second page buffer 631_0. In another embodiment, as shown in FIG. 11, the first plane switch 740_0 and the second plane switch 741_0 can be omitted, since the first bit line 620_0 is kept being coupled to the first page buffer 630_0 and the second bit line 621_0 is kept being coupled to the second page buffer 631_0, as the first bit line 620_0 and the second bit line 621_0 do in FIG. 6.

Figure 8:
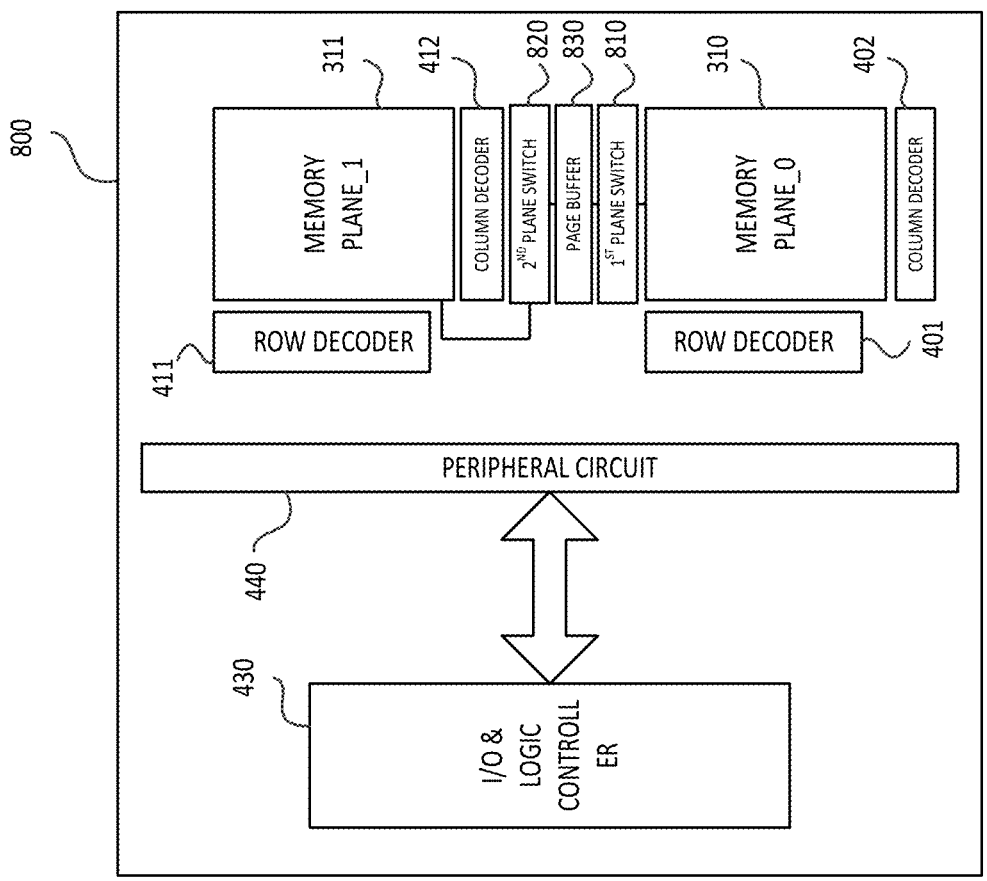
FIG. 8 shows an exemplary block diagram of a memory device according to some embodiment of the disclosure.

FIG. 8 shows an exemplary block diagram of a memory device 800 according to some embodiments of the disclosure. The memory device 800 can differ from the SSD 400 of FIG. 4 at least in that the memory device 800 of FIG. 8 can include a first plane switch 810, a second plane switch 820 and a page buffer 830 that replace the page buffer_0 403 and the page buffer_1 413 of the SSD 400 of FIG. 4. The first plane switch 810 can couple the bit lines of the memory plane_0 310 to the page buffer 830. The second plane switch 820 can coupled the bit lines of the memory plane_1 311 also to the page buffer 830. In the exemplary memory device 800, the first memory plane_0 310 (or their bit lines) and the second memory plane_1 311 (or their bit lines) can share the page buffer 830.

In an embodiment, the memory device 800 can further include a plane switch controller, e.g., the I/O and logic controller 430. The plane switch controller 430 can be coupled to the first plane switch 810 and the second plane switch 820, and be configured to activate the first plane switch 810 or the second plane switch 820. For example, the plane switch controller 430 can activate the first plane switch 810 or the second plane switch 820 when the memory device 800 is operating in an erase mode. As another example, the plane switch controller 430 can activate the first plane switch 810 or the second plane switch 820 when the memory device 800 is operating in a program mode or a read mode.

As mentioned previously, the bit lines, when too long, will have large parasitic parameters and long charging time, and the 3D memory can consume high power accordingly.

Figure 9:
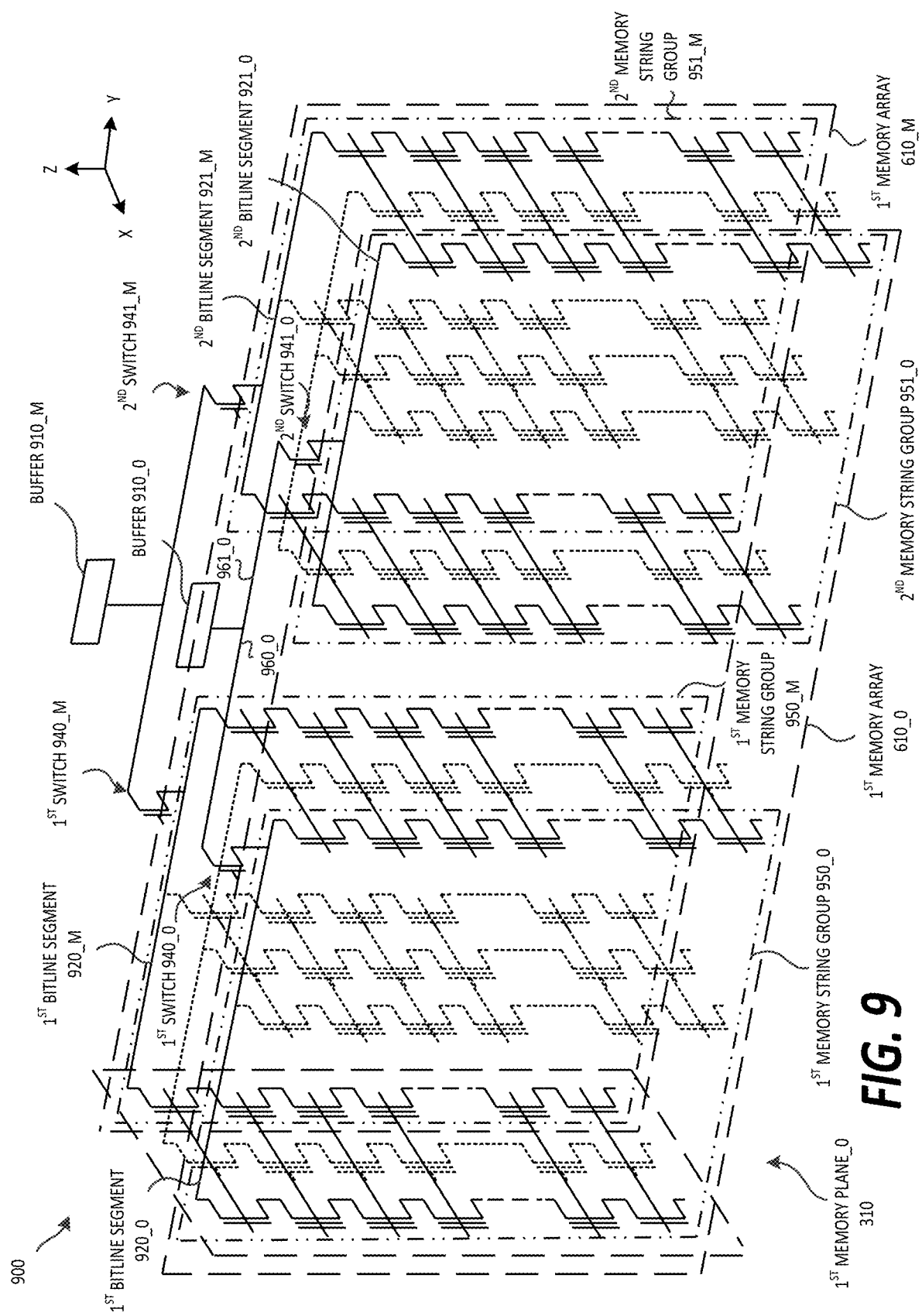
FIG. 9 shows an exemplary memory device according to some embodiment of the disclosure.

FIG. 9 shows an exemplary memory device 900 according to some embodiments of the disclosure. For example, the memory device 900 can include the first memory plane_0 310, first bit line segments 920_0 to 920_m, second bit line segments 921_0 to 921_m, first switches 940_0 to 940_m, second switches 941_0 to 941_m, and buffers 910_0 to 910_m. In an embodiment, each of the memory arrays 610_0 to 610_m of the first memory plane_0 310 can be divided into a first memory string group that is coupled to a corresponding one of the first bit line segments 920_0 to 920_m and a second memory string group that is coupled to a corresponding one of the second bit line segments 921_0 to 921_m. For example, the memory array 610_0 can be divided into a first memory string group 950_0 and a second memory string group 951_0. In an embodiment, the first memory string group 950_0 and the second memory string group 951_0 can include the same number of the memory strings 210. In another embodiment, the first memory string group 950_0 and the second memory string group 951_0 can include different numbers of the memory strings 210. As another example, the memory array 610_m can be divided into a first memory string group 950_m and a second memory string group 951_m. In an embodiment, the first memory string group 950_m and the second memory string group 951_m can include the same number of the memory strings 210. In another embodiment, the first memory string group 950_m and the second memory string group 951_m can include different numbers of the memory strings 210. In yet another embodiment, the first memory string group 950_0 and the first memory string group 950_m can include the same number of the memory strings 210. In still another embodiment, the first memory string group 950_0 and the first memory string group 950_m can include different numbers of the memory strings 210. For example, the first bit line segment 920_0 can be disposed between the first memory string group 950_0 and the buffer 910_0 and be connected to the buffer 910_0 through a first conduction path 960_0, and the second bit line segment 911_0 can be disposed between the second memory string group 951_0 and the buffer 910_0 and be connected to the buffer 910_0 through a second conduction path 961_0. As another example, the buffer 910_0 can be disposed closer to the first bit line segment 920_0 than to the first memory string group 950_0 and be connected to the first bit line segment 920_0 through the first conduction path 960_0, and the buffer 910_0 can also be disposed closer to the second bit line segment 921_0 than to the second memory string group 951_0 and be connected to the second bit line segment 921_0 through the second conduction path 961_0. In an embodiment, the first switch 940_0 can be disposed in the first conduction path 960_0 and be turned on to couple the first bit line segment 920_0 to the buffer 910_0 in response to a first switch signal, and the second switch 941_0 can be disposed in the second conduction path 961_0 and be turned on to couple the second bit line segment 921_0 to the buffer 910_0 in response to a second switch signal.

The first switches 940_0 to 940_m can couple the first bit line segments 920_0 to 920_m to the buffers 910_0 to 910_m when activated. For example, the first switch 940_0 can couple the first bit line segment 920_0 to the buffer 910_0 when activated in response to a first switch signal. As another example, the first switch 940_m can couple the first bit line segment 920_m to the buffer 910_m when activated. The second switches 941_0 to 941_m can couple the second bit line segments 921_0 to 921_m to the buffers 910_0 to 910_m when activated in response to a second switch signal. For example, the second switch 941_0 can couple the second bit line segment 921_0 to the buffer 910_0 when activated. As another example, the second switch 941_m can couple the second bit line segment 921_m to the buffer 910_m when activated.

In an embodiment, the memory device 900 can further include a switch controller, e.g., the I/O and logic controller 430. The switch controller 430 can be coupled to the first switches 940_0 to 940_m and the second switches 941_0 to 941_m. For example, the switch controller 430 can activate the first switches 940_0 to 940_m or the second switches 941_0 to 941_m when the memory device 900 is operating in a program mode or a read mode. As another example, the switch controller 430 can activate the first switches 940_0 to 940_m and the second switches 941_0 to 941_m when the memory device 900 is operating in an erase mode.

Compared with the first memory plane_0 310 shown in FIG. 6, which is coupled to the first bit lines 620_0 to 620_m, the first memory plane_0 310 of the memory device 900 of FIG. 9 is coupled to the first bit line segments 920_0 to 920_m and the second bit line segments 921_0 to 921_m, each of which is shorter than a corresponding one of the first bit line 620_0 to 620_m. Accordingly, the first bit line segments 920_0 to 920_m and the second bit line segments 921_0 to 921_m can have smaller parasitic parameters and shorter charging time, and the memory device 900 can consume less power. Besides, as the first bit line segment 920_0 can be disposed between the first memory string group 950_0 and the buffer 910_0 and the second bit line segment 911_0 can be disposed between the second memory string group 951_0 and the buffer 910_0, or the buffer 910_0 can be disposed closer to the first bit line segment 920_0 than to the first memory string group 950_0 and the buffer 910_0 can also be disposed closer to the second bit line segment 921_0 than to the second memory string group 951_0, the layer numbers or the thickness of the first memory string group 950_0 and the second memory string group 951_0 and their corresponding wordlines do not affect the length between the buffer 910_0 and the first bit line segment 920_0 and the second bit line segment 921_0. Therefore, the first bit line segments 920_0 to 920_m and the second bit line segments 921_0 to 921_m can still have small parasitic parameters and short charging time even when the layer numbers or the thickness of the first memory string group 950_0 and the second memory string group 951_0 are increased. As the first bit line segment 920_0 and the second bit line segment 921_0 can be coupled to the buffer 910_0 directly, without going through channels penetrating the first memory string group 950_0 and the second memory string group 951_1, the coupling of the buffer 910_0 to the first bit line segment 920_0 and the second bit line segment 921_0 can be realized very easily, even when the layer numbers or the thickness of the first memory string group 950_0 and the second memory string group 951_0, and the length of the channels as well, are increased. As the first bit line segment 920_0 and the second bit line segment 921_0 can be coupled to the buffer 910_0 directly, without going through the channels, the coupling of the buffer 910_0 to the first bit line segment 920_0 and the second bit line segment 921_0 can be realized very flexibly, unlike the formation of the channels, the location of which have to be selected in a limited manner based on the structures of the first memory string group 950_0 and the second memory string group 951_0.

Figure 10:
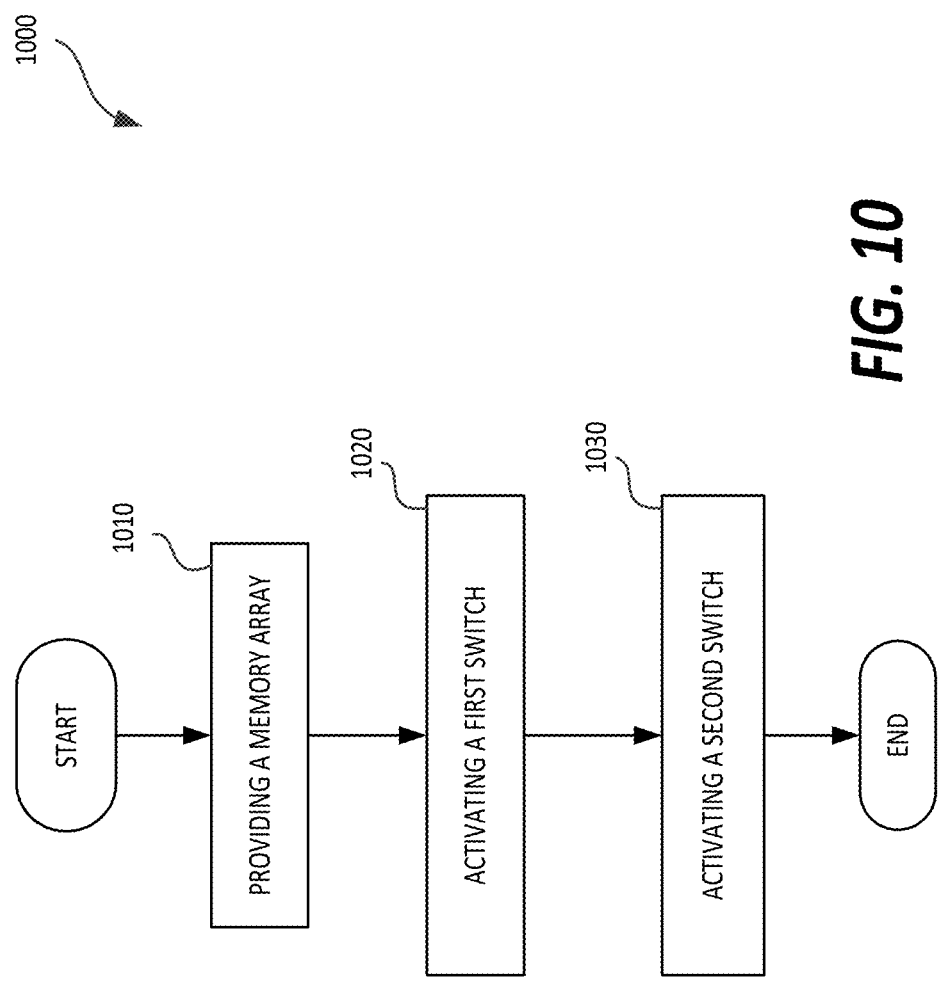
FIG. 10 shows a flow chart illustrating an exemplary method according to some embodiments of the disclosure.

FIG. 10 shows a flow chart illustrating an exemplary method 1000 for operating a memory array of a memory plane of a memory device according to some embodiments of the disclosure. For example, the memory device can be the memory device 900, and the memory plane can be the first memory plane_0 310. In an embodiment, the method 1000 can activate the first switches 940_0 to 940_m to couple the first bit line segments 920_0 to 920_m, and the first memory string group 950_0 to 950_m as well, to the buffers 910_0 to 910_m. In another embodiment, the method 1000 can activate the second switches 941_0 to 941_m to couple the second bit line segments 921_0 to 921_m, and the second memory string group 951_0 to 951_m as well, to the buffers 910_0 to 910_m. In various embodiments, some of the steps of the method 1000 shown can be performed concurrently or in a different order than shown, can be substituted by other method steps, or can be omitted. Additional method steps can also be performed as desired. Aspects of the method 1000 can be implemented by a memory device, such as the memory device 900 illustrated in and described with respect to the preceding figures.

At step 1010, a memory array is provided. For example, the memory array can be the first memory array 610_0 of the first memory plane_0 310. In an embodiment, the first memory array 610_0 can be divided into a first memory string group, e.g., the first memory string group 950_0, and a second memory string group, e.g., the second memory string group 951_0. For example, the first memory string group 950_0 can be coupled to a first bit line segment, e.g., the first bit line segment 920_0, and the first bit line segment 920_0 can be coupled to a first switch, e.g., the first switch 940_0. As another example, the second memory string group 951_0 can be coupled to a second bit line segment, e.g., the second bit line segment 921_0, and the second bit line segment 921_0 can be coupled to a second switch, e.g., the second switch 941_0.

At step 1020, the first switch 940_0 can be activated by a switch controller, e.g., the I/O and logic controller 430, to couple the first bit line segment 920_0 to a buffer, e.g., the buffer 910_0, when a first switch signal is received indicating that a process, such as reading, programming and erasing processes, is to be performed on the first memory string group 950_0.

At step 1030, the second switch 941_0 can be activated by the I/O and logic controller 430 to couple the second bit line segment 921_0 to the buffer 910_0 when a second switch signal is received indicating that the process is to be performed on the second memory string group 951_0.

The processes and functions described herein can be implemented as a computer program which, when executed by one or more processors, can cause the one or more processors to perform the respective processes and functions. The computer program may be stored or distributed on a suitable medium, such as an optical storage medium or a solid-state medium supplied together with, or as part of, other hardware. The computer program may also be distributed in other forms, such as via the Internet or other wired or wireless telecommunication systems. For example, the computer program can be obtained and loaded into an apparatus, including obtaining the computer program through physical medium or distributed system, including, for example, from a server connected to the Internet.

The computer program may be accessible from a computer-readable medium providing program instructions for use by or in connection with a computer or any instruction execution system. The computer readable medium may include any apparatus that stores, communicates, propagates, or transports the computer program for use by or in connection with an instruction execution system, apparatus, or device. The computer-readable medium can be magnetic, optical, electronic, electromagnetic, infrared, or semiconductor system (or apparatus or device) or a propagation medium. The computer-readable medium may include a computer-readable non-transitory storage medium such as a semiconductor or solid state memory, magnetic tape, a removable computer diskette, a random access memory (RAM), a read-only memory (ROM), a magnetic disk and an optical disk, and the like. The computer-readable non-transitory storage medium can include all types of computer readable medium, including magnetic storage medium, optical storage medium, flash medium, and solid state storage medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory array including a plurality of memory strings arranged in a direction, the memory strings including at least a first memory string group and a second memory string group;
a bit line including a first bit line segment coupled to the first memory string group and a second bit line segment coupled to the second memory string group; and
a buffer coupled to the memory array by the bit line,
wherein the buffer is disposed physically over the first bit line segment, the first bit line segment is disposed physically over the first memory string group, the buffer is disposed physically over the second bit line segment, the second bit line segment is disposed physically over the second memory string group, the memory array is included in a first die, and the buffer is included in a second die that is separated from and bonded to the first die.

2. The memory device of claim 1, further comprising vias, wherein the first bit line segment is coupled to the buffer by the vias.

3. The memory device of claim 1, further comprising:
a first switch coupled between the buffer and the first bit line segment, the first switch configured to be turned on to couple the first bit line segment to the buffer in response to a first switch signal; and
a second switch coupled between the buffer and the second bit line segment, the second switch configured to be turned on to couple the second bit line segment to the buffer in response to a second switch signal.

4. The memory device of claim 3, wherein one of the first switch and the second switch is turned on when the memory device is operating in a program mode or a read mode.

5. The memory device of claim 3, wherein both the first switch and the second switch are turned on when the memory device is operating in an erase mode.

6. The memory device of claim 3, wherein the bit line segment is included in the first die, and the first switch and the second switch are included in the second die.

7. The memory device of claim 1, further comprising a first memory plane, wherein the first memory string group and the second memory string group are included in the first memory plane.

8. A memory device, comprising:
a first memory plane that includes a plurality of first memory arrays;
first bit lines coupled to the first memory arrays of the first memory plane, respectively;
a second memory plane that includes a plurality of second memory arrays;

second bit lines coupled to the second memory arrays of the second memory plane, respectively; and page buffers each coupled to a corresponding one of the first bit lines and a corresponding one of the second bit lines, wherein the page buffers are disposed physically over the first bit lines the first bit lines are disposed physically over the first memory plane, the page buffers are disposed physically over the second bit lines, the second bit lines are disposed physically over the second memory plane, the first and second memory planes are included in a first die, and the page buffers are included in a second die that is separated from and bonded to the first die.

9. The memory device of claim 8, further comprising first plane switches and second plane switches, wherein each of the page buffers is coupled via one of the first plane switches to a corresponding one of the first bit lines and coupled via one of the second plane switches to a corresponding one of the second bit lines.

10. The memory device of claim 9, wherein the first plane switches or the second plane switches are turned on when the memory device is operating in an erase mode, a program mode or a read mode.

11. The memory device of claim 9, wherein the first and second memory planes and the first and second bit lines are included in a first die, and the page buffers and the first and second plane switches are included in a second die that is separated from and bonded to the first die.

12. The memory device of claim 8, wherein one of the first memory arrays of the first memory plane includes a plurality of memory strings, the memory strings being divided into at least a first memory string group and a second memory string group, one of the first bit lines that is coupled to the one of the first memory arrays of the first memory plane includes a first bit line segment coupled to the first memory string group and a second bit line segment coupled to the second memory string group, and the memory device further comprises a buffer coupled to the one of the first memory array by the one of the first bit lines.

13. The memory device of claim 12, further comprising:

a first switch coupled between the buffer and the first bit line segment, the first switch configured to be turned on to couple the first bit line segment to the buffer in response to a first switch signal; and a second switch coupled between the buffer and the second bit line segment, the second switch configured to be turned on to couple the second bit line segment to the buffer in response to a second switch signal.

14. The memory device of claim 13, wherein one of the first switch and the second switch is turned on when the memory device is operating in a program mode or a read mode.

15. The memory device of claim 13, wherein both the first switch and the second switch are turned on when the memory device is operating in an erase mode.

16. The memory device of claim 12, wherein the buffer is disposed closer to the first bit line segment than to the first memory string group, and the buffer is disposed closer to the second bit line segment than to the second memory string group.

17. The memory device of claim 12, further comprising vias, wherein the first bit line segment is coupled to the buffer by the vias.

* * * * *